United States Patent
Kuttan et al.

(10) Patent No.: US 9,941,936 B2
(45) Date of Patent: Apr. 10, 2018

(54) METHOD AND APPARATUS FOR RADIO MODULATOR AND ANTENNA DRIVER

(71) Applicant: Intel IP Corporation, Santa Clara, CA (US)

(72) Inventors: Sathish K. Kuttan, San Jose, CA (US); Jean-Yves Michel, Vallauris (FR)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/978,652

(22) Filed: Dec. 22, 2015

(65) Prior Publication Data

US 2017/0180013 A1    Jun. 22, 2017

(51) Int. Cl.
*H04B 1/04* (2006.01)
*H04B 5/00* (2006.01)
*H04L 25/49* (2006.01)
*H03K 7/08* (2006.01)

(52) U.S. Cl.
CPC ............ *H04B 5/0081* (2013.01); *H03K 7/08* (2013.01); *H04B 1/0458* (2013.01); *H04B 1/0475* (2013.01); *H04B 5/0031* (2013.01); *H04B 5/0075* (2013.01); *H04L 25/4902* (2013.01); *H04B 2001/0408* (2013.01)

(58) Field of Classification Search
CPC ... H03K 7/02; H03K 7/04; H03K 7/08; H04B 1/0408; H04B 1/0433; H04B 1/0458; H04B 1/0475; H04B 5/0012; H04B 5/0025; H04B 5/0031; H04B 5/0037; H04B 5/0075; H04B 5/0081; H04B 2001/0408; H04L 25/40; H04L 25/4902

USPC ........ 375/238, 239, 257; 332/109, 112, 115; 341/143; 370/212, 213
See application file for complete search history.

(56) References Cited

U.S. PATENT DOCUMENTS

| | | | | |
|---|---|---|---|---|
| 6,987,851 B1* | 1/2006 | Toumani | ............... | H04M 3/007 330/297 |
| 2002/0079963 A1* | 6/2002 | Kusunoki | ............. | H03F 1/3288 330/149 |
| 2009/0058323 A1* | 3/2009 | Yang | .................. | H05B 33/0818 315/307 |
| 2013/0127428 A1* | 5/2013 | Ide | .......................... | G05F 1/468 323/271 |

(Continued)

*Primary Examiner* — Young T Tse
(74) *Attorney, Agent, or Firm* — Schiff Hardin LLP

(57) ABSTRACT

A communication device includes a pulse width modulator that is provided with an oscillator signal at a communication carrier frequency. The pulse width modulator input is an amplified reference voltage that is regulated by a feedback loop. A modulation control provides the data signal to be transmitted. The modulation control may either be provided to the amplifier mixed with the reference voltage or may be provided to the pulse width modulator. A power transistor receives the pulse width modulator output and generates a chip output signal. An external filter is connected at the chip output to filter the signal that is provided to the communication antenna and produce a carrier sinusoid with an amplitude proportional to the pulse width modulated by voltage regulation and by the modulating data input. The power source is connected to the external filter. A differential version includes differential outputs from the pulse width modulator to two power transistors and through two external filters to a differential antenna.

21 Claims, 9 Drawing Sheets

(56) References Cited

U.S. PATENT DOCUMENTS

2014/0292327 A1* 10/2014 Griswold ........... G01R 33/3614
324/309

* cited by examiner

METHOD AND APPARATUS FOR RADIO MODULATOR AND ANTENNA DRIVER

TECHNICAL FIELD

The present disclosure relates generally to a method and apparatus for electronic communication, and more particularly to a method and apparatus for near field radio communications.

BACKGROUND

Some smartphones and other devices, particularly portable devices, are capable of communicating with one another using near field communication (NFC). The devices may communicate with each other when touching the devices together or by bringing the devices into close proximity with one another. In certain examples, the communication range for near field communications is about 10 centimeters. According to one standard, near field communication devices use electromagnetic induction between two loop antennas in the respective devices to communicate in the radio frequency band of 13.56 MHz. Some of the devices may be passive with no battery of their own but may harvest energy for their operation from the other communicating device through the magnetic induction.

Effective near field communication requires generation of a relatively large magnetic field by the antenna, for example, to be able to power battery-less passive NFC devices. Portable devices such as smartphones tend to have small volumes in which to fit antennas. The requirement to generate the large magnetic field from a small antenna in a battery operated device has resulted in near field communication circuits that have a high cost, particularly for the radio frequency (RF) power amplifier component and the voltage regulator component of the near field communication device. In addition to high costs, operating the near field communication devices result in high power dissipation and thus battery drain due to relatively low efficiencies in the RF power amplifier and the voltage regulator. The heat generated by the power dissipation of the low efficiency components results in thermal issues, i.e. the requirement to provide cooling and the need to provide circuit elements that will operate when subject to thermal stress.

DETAILED DESCRIPTION

Figure 1A:
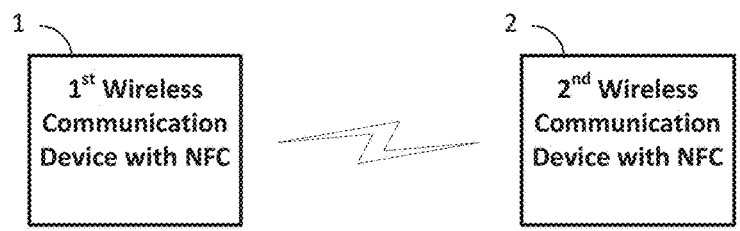
FIG. 1A is a functional block diagram of a near field communication system over which the present device represents an improvement.

For battery operated devices, such as smartphones, tablets, personal electronic devices, and other mobile and non-mobile devices, near field communication (NFC) requires that a large magnetic field is generated with a small antenna, often using battery power. A near field communication circuit typically includes a radio frequency (RF) power amplifier to generate radio frequency signals at sufficiently voltage and current levels to provide inductive communication to another device through the antenna. The near field communication circuit also typically includes a voltage regulator to generate a regulated voltage for supply to the RF power amplifier. The voltage regulator may be an important part of the near field communication device where a noisy power source, such the output from a battery, is used as the power source.

In order to better understand the advantages of the present near field communication devices according to this disclosure, the following will first present typical examples of conventional near field communications devices. In some typical conventional devices, the RF power amplifier and the power supply must be provided with filters to filter the output signals to prevent electromagnetic interference (EMI). The addition of the filter for the output signals increases the costs for near field communication devices. In some conventional near field communication devices, the power amplifiers and the power regulators that have been used have low efficiency and thus result in high power dissipation. The high power dissipation results in heat being generated by the device, which must be addressed by measures that, for example, may increase the cost of the device.

Efforts to address the power dissipation issues in near field communication devices have led to utilization of Class D amplifiers as the RF power amplifier component, but the ON-OFF switching of a Class D amplifier at radio frequencies results in unwanted electromagnetic signals, which requires that an EMI (electromagnetic interference) filter be added at the radio frequency output. As noted above, the addition of the filter adds to the cost of the device. Filters are also used for Class D amplifiers to adapt the impedance of the antenna matching network. The impedance varies significantly as a card or other device is moved into the field generated by the antenna. Because the output current of a Class D amplifier depends on the impedance, a filter is added to lower the variation of impedance seen by the amplifier when a card or other device is moving into the antenna field.

In other near field communication devices, efforts to reduce device costs have led to use of a Class A amplifier as the RF power amplifier, but Class A amplifiers have a lower efficiency, which results in higher power dissipation by the device. The high power dissipation requires measures to address the heat that is generated, such as requiring the addition of heat dissipation devices.

In yet other near field communication devices, the voltage regulator component is located off of the circuit chip on which the other components of the near field communication device are provided. The off-chip location of the voltage regulator moves some of the heat source off of the near field communication chip, but the requirement to provide the voltage regulator at an off-chip location results in higher device costs. If the voltage regulator being used is a DCDC converter, the voltage regulator usually has good efficiency and power dissipation may not be an issue.

In FIG. 1A is shown a near field communication (NFC) system comprising a first wireless communication device 1 having NFC communication capabilities, and a second wireless communication device 2 having NFC communication capabilities. The first wireless communication device 1 and the second wireless communication device 2 are configured to communicate in accordance with a NFC protocol.

Figure 1B:
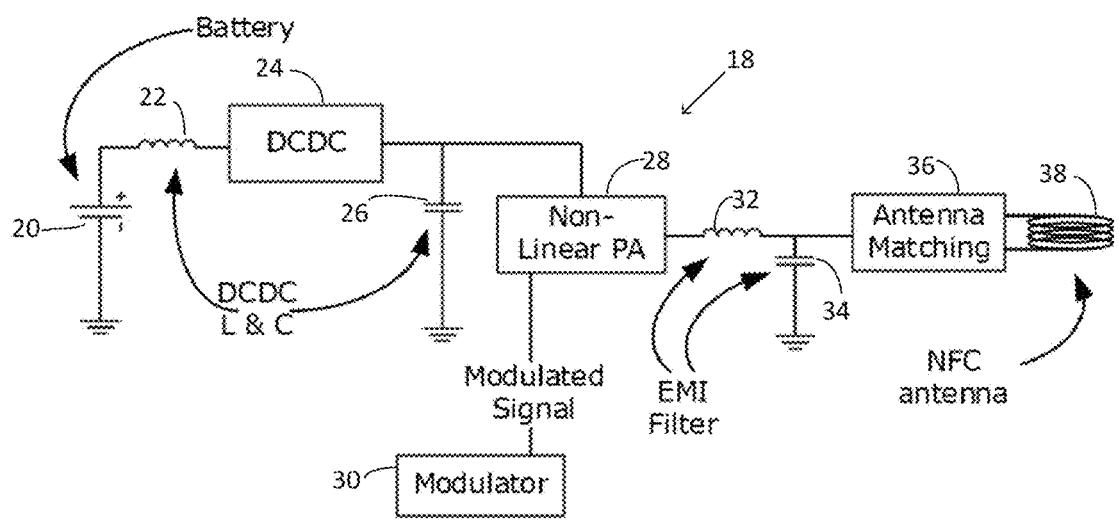
FIG. 1B is a functional block diagram of a near field communication device over which the present device represents an improvement.

In FIG. 1B is shown a NFC device 18 as used in a portable device, such as a smartphone, tablet, computer, personal electronic device, or other device. The NFC device 18 described here and elsewhere in this specification provides a transmitter portion for transmitting information. A receiver portion of a NFC device is not shown, although a receiver may be provided and may even share some components with the transmitter. The near field communication device 18 is powered by a battery 20, which is a 3.6 volt battery in the example. The battery 20 is connected through an inductor 22 to a DCDC voltage regulator 24. The DCDC controller circuit is also powered by the battery in order to drive the power switches. The power connection is not shown here but will be understood by those of skill in the art. The output of the DCDC voltage regulator 24 is connected to a capacitor 26, the other end of which is connected to ground. Together, the inductor 22 and capacitor 26 form a filter for the voltage regulator 24. The voltage regulator 24 operates to provide a regulated voltage greater than 4V at its output.

The regulated output of the DCDC voltage regulator 24 is connected to a non-linear radio frequency power amplifier 28. The radio frequency (RF) power amplifier operates to generate a radio frequency signal at the NFC (near field communication) frequency. The radio frequency signal is modulated with a data signal or other information to be communicated. The data signal or other information is provided to the radio frequency power amplifier 28 by a modulator 30 that supplies a modulated or modulator signal to a modulator input of the power amplifier 28. The modulated radio frequency output of the power amplifier 28 is filtered by an EMI (electromagnetic interference) filter that is formed of an inductor 32, connected in line, and a capacitor 34, the other end of which is connected to ground. The EMI filter 32 and 34 removes unwanted harmonic and other high frequency components of the signal that might otherwise interfere with other electronics.

The filtered output is provided to an antenna matching circuit 36 that matches the output impedance of the circuit to the input impedance of a near field communication antenna 38. The antenna 38 emits a near field signal that may be used to inductively communicate information to and from other near field communication devices in a contactless manner. In the example of FIG. 1B, the non-linear radio frequency power amplifier 28 is of a type that requires an EMI filter at the RF output, such as a Class D amplifier.

Figure 2:
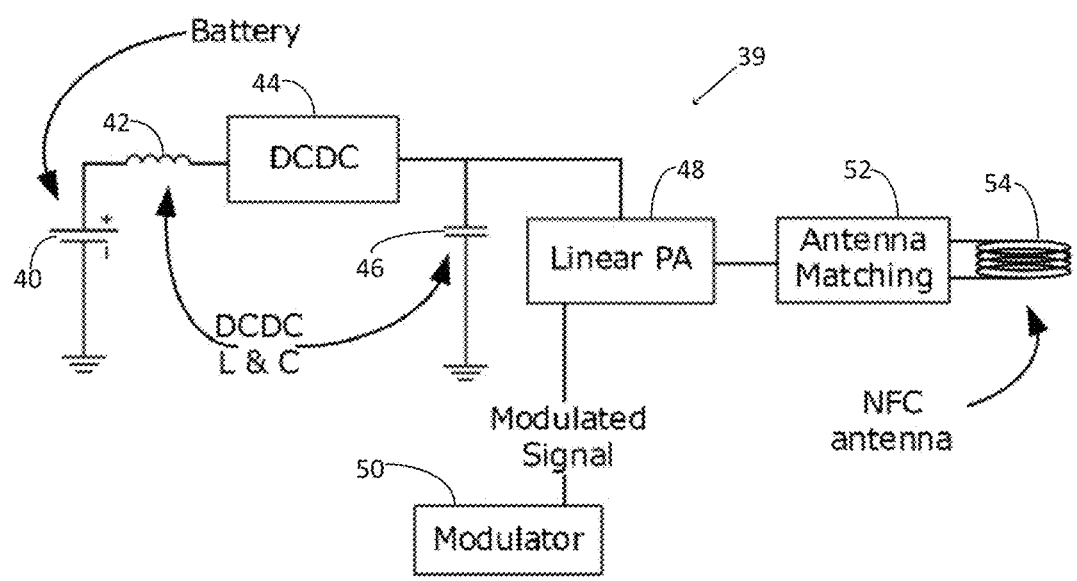
FIG. 2 is a functional block diagram of another near field communication device over which the present device represents an improvement.

In FIG. 2, a near field communication (NFC) device 39 is provided for a mobile device or other device. The near field communication device 39 is powered by a battery 40 that is connected to an in-line inductor 42 which in turn is connected at an input of a DCDC voltage regulator 44. The battery 40 in the example is a 3.6 volt battery. The typical battery in portable equipment provides about 3 volts. The DCDC regulator operates to convert the 3 volt signal to 5 volts. The illustrated DCDC regulator is a step-up or boost DCDC regulator. By contrast, a step-down or buck regulator generally has an inductor connected between the output of the regulator and the capacitor. The voltage regulator 44 provides a regulated voltage at its output. The output of the DCDC voltage regulator 44 is connected a capacitor 46, the other end of which is connected to ground. Together, the inductor 42 and capacitor 46 filter the output signal of the voltage regulator 44.

The regulated output of the voltage regulator 44 is connected to an input of a linear radio frequency (RF) power amplifier 48. Data or other information to be communicated by the near field communication device 39 is provided to the RF power amplifier 48 as a modulated signal from a modulator 50. The linear RF power amplifier 48 of the illustrated aspect is of a type that does not require EMI filtering at the output, and may be, for example, a Class A amplifier. The output of the power amplifier 48 is connected to an antenna matching circuit 52, which couples the signal to the near field communication antenna 54. The near field communication device 39 operates to inductively communicate with other near field communication devices. In the example of FIG. 2, the linear power amplifier may be a Class A amplifier, which may produce excessive heat as a result of inefficiencies of the amplifier.

Figure 3:
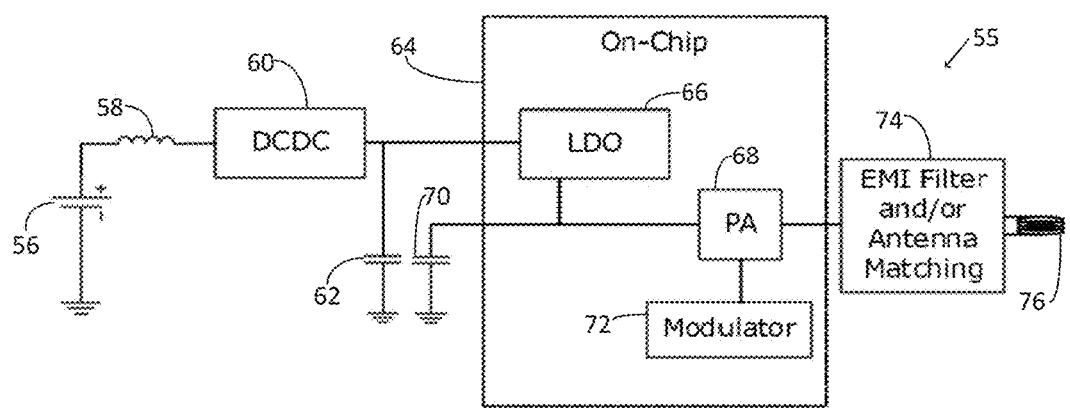
FIG. 3 is a functional block diagram showing chip location of functional elements of a near field communication device over which the present device represents an improvement.

Turning to FIG. 3, a near field communication device 55 such as may be used in a mobile device or other device is powered by a battery 56 that is connected by an inductor 58 to an input of a DCDC voltage regulator 60. The output of the voltage regulator is connected to a capacitor 62, the other end of which is connected to ground. The inductor 58 and capacitor 62 filter the regulated output of the voltage regulator. The regulated output of the DCDC voltage regulator 60 is supplied to a chip 64, indicated schematically by a block. In the illustrated example, the regulated voltage is 5 volts. The power supply including the voltage regulator 60 is external to the chip 64.

On the chip 64, the regulated voltage signal is provided to an LDO (low dropout) regulator 66. The output of the LDO regulator 66 is provided to an input of a radio frequency (RF) power amplifier 68 that is also on the chip 64. The output of the LDO regulator 66 is also connected to a capacitor 70, the other end of which is connected to ground. The capacitor 70 is mounted off-chip. An on-chip modulator 72 provides a modulator signal to the power amplifier 68 by which the radio frequency output of the power amplifier is modulated with data or other information. The modulated output of the power amplifier 68 is sent off-chip to an EMI filter and antenna matching circuit 74, which in turn supplies the signal to the near field communication antenna 76.

As noted above, the voltage regulator 60 has been moved off the chip of the power amplifier to reduce thermal stress on the chip. The use of off-chip components and an off-chip voltage regulator increases the cost of the near field communication device.

Figure 4:
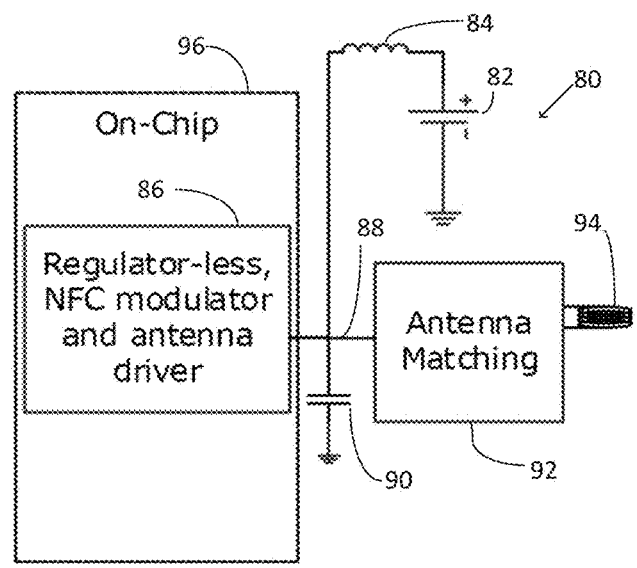
FIG. 4 is a functional block diagram showing chip location of components of a near field communication device in accordance with an aspect of the disclosure.

Referring to FIG. 4, a near field communication device 80 for a smart phone, tablet, personal electronic device, or other mobile or non-mobile device is shown. In particular, the illustrated device 80 provides a transmitter portion. Two-way near field communications also utilize a receiver portion, which is not shown in this application. The receiver portion may share some of the components that are used in the transmitter portion. For inbound near field communications, the inbound signal may be a load modulation signal, as will be understood by those of skill in the art. The near field communication transmitter device is powered by a battery 82 that is connected to an in-line inductor 84, that in turn is connected to an output 88 of a regulator-less near field communication modulator and antenna driver 86. Power is supplied to the modulator and antenna driver 86 via the battery power supplied to the output 88. The output 88 is connected to a capacitor 90, the other end of which is connected to ground. The output 88 is also connected to an antenna matching circuit 92 that matches the output impedance of the output 88 to the impedance of a near field antenna 94. The regulator-less near field communication modulator and antenna driver 86 is provided on a chip 96. In the illustrated near field communication device, the regulator-less near field communication modulator and antenna driver 86 are contained entirely on the chip 96, with only the inductor 84, capacitor 90, battery 82, antenna matching circuit 92 and the antenna 94 being provided off chip. The reduction in off-chip components lowers the cost of the near field communication device.

Figure 5:
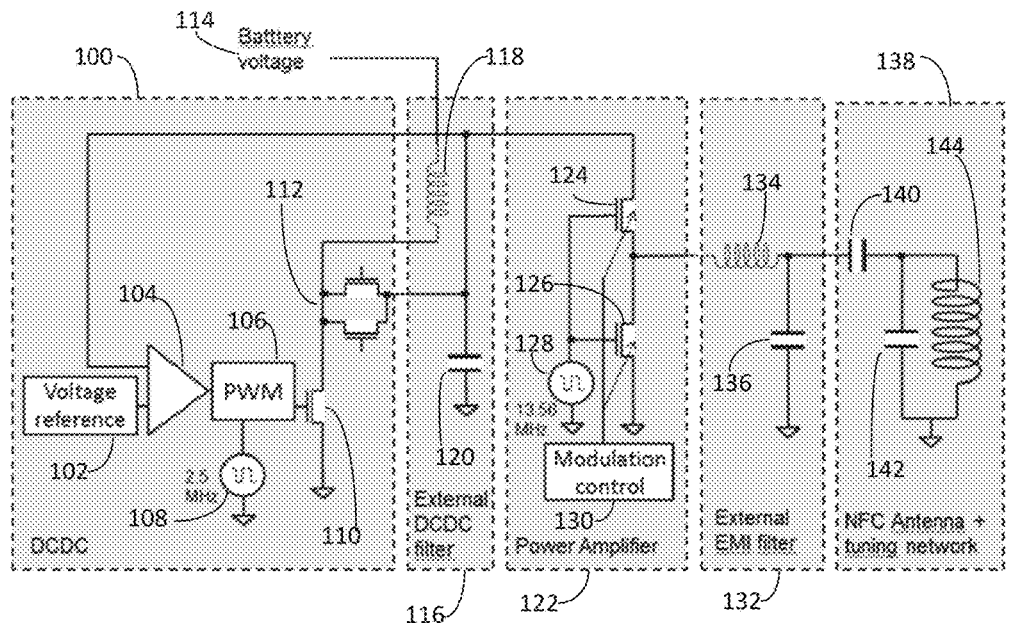
FIG. 5 is a circuit diagram of a near field communication device of the prior art.

A more detailed view of a conventional near field communication device is provided in FIG. 5. In a function block 100 is a DCDC voltage regulator that includes a voltage reference 102 that is connected to an input of an amplifier, such as an operational amplifier 104. The operational amplifier 104, which serves here as an error amplifier, has its output connected to a pulse width modulator (PWM) 106 that has a reference signal input connected to an oscillator 108. The oscillator 108 of the illustrated example is a 2.5 MHz oscillator, although other oscillators may of course be used. The output of the pulse width modulator 106 is provided to the gate of a FET (field effect transistor) 110. A pair of transistors 112, here an N-FET and a P-FET are connected in a switch configuration between the inductor 118 and the capacitor 120. The voltage boost and regulation function is provided by three power transistors 110 and 112, the pulse width modulator 106, an oscillator 108 and a linear control loop.

The DCDC voltage regulator 100 is powered by battery voltage 114, such as from a battery. The output voltage is provided as a feedback voltage to a second input of the operational amplifier 104 to form a control loop using the amplifier as an error amplifier. Note that the lead from the battery voltage 114 to the inductor 118 crosses the lead for the feedback of the output voltage without connecting, as indicated by the absence of a dot to indicate a connection. The output of voltage regulator 100 is provided to an external DCDC filter 116 that includes an inductor 118 connected in line from the battery voltage 114 to supply power to the transistors 110 and 112. The output of the transistor pair 112 is connected to a capacitor 120, the other end of which is connected to ground. The inductor 118 and capacitor 120 operate to filter the output signal from the voltage regulator 100. The filter 116 provides an LC filter for the DCDC output of the voltage regulator 100.

The output of the filter 116 is a regulated voltage that is connected to an input of a power amplifier 122. The power amplifier 122 includes a pair of power transistors 124 and 126 that have their gates connected to a 13.56 MHz oscillator 128. Data or information signals are modulated on the radio frequency signal by a modulation control 130 that is indirectly connected to the power transistors 124 and 126. The modulation control 130 is connected in such a way as to change the impedance of the power transistors 124 and 126. In some conventions, the indirect connection is shown by dotted lines. The power amplifier 122 is configured as a Class D power amplifier with two power transistors 124 and 126, a carrier frequency oscillator 128, and an amplitude modulation control device 130.

The power amplifier 122 generates unwanted signals that are removed by an external EMI filter 132 that includes an inductor 134 connected in line with the output of the power amplifier 122 and a capacitor 136, the other end of which is connected to ground. The external EMI filter 132 reduces spurious emissions.

The output of the filter 132 is connected to a near field communication antenna and tuning network 138 that includes a capacitor 140 in line with the input signal, a capacitor 42, the other end of which is connected to ground, and an antenna 144. The antenna 144 is a near field communication loop antenna. The antenna and tuning network 138 is similar to the antenna and tuning circuits used in other circuits described herein.

Figure 6:
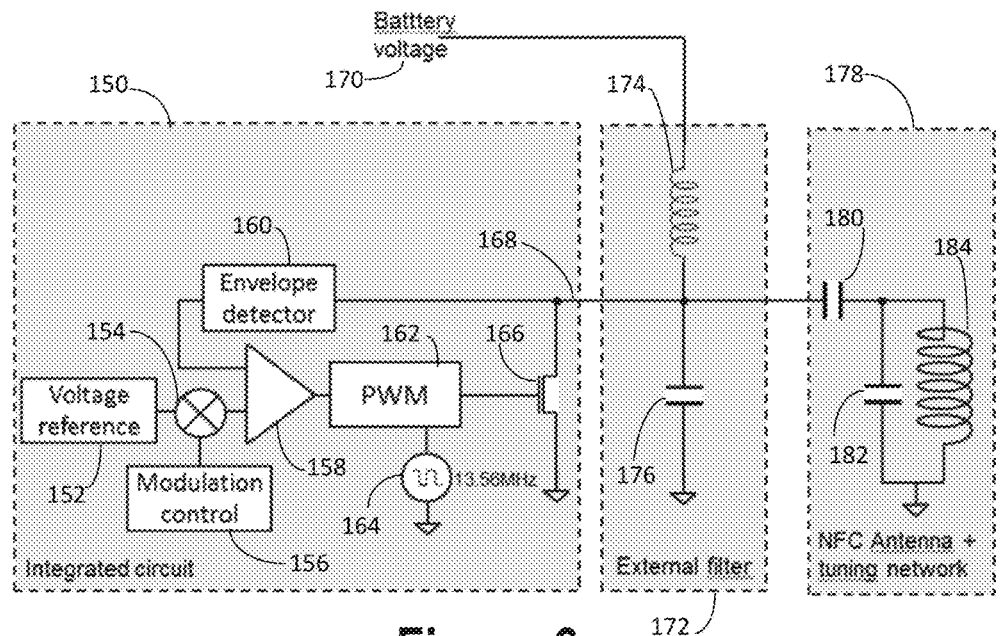
FIG. 6 is a circuit diagram of a near field communication device in accordance with an aspect of the disclosure.

A more detailed view of the present near field communication device of FIG. 4 is shown in FIG. 6, specifically a transmitter portion of a near field communication device is shown. In this example, an integrated circuit 150 is provided with components formed thereon. The components include a voltage reference 152 that has its output connected to a multiplier 154. The other input of the mixer or multiplier 154 is connected to a modulation control 156. The modulation control 156 is shown as a block which may represent both the signal source and the apparatus for transfer of the signal to the mixer or multiplier 154. The modulation control 156 may represent an apparatus or circuit that is connected to receive signals from a signal source (not shown) for transmission via the near field communication. The signal source may provide stored signals or generated signals or detected signals. In certain examples, the modulation control 156 provides a sequence of line encoded bits that are to be transmitted. The source of the signals may be within the NFC controller device or from outside the NFC controller device. In most practical implementations, the source is within the NFC controller device. The output of the mixer or multiplier 154 supplies the modulated signal to an input of an amplifier 158. The amplifier 158 of certain aspects may be an operational amplifier. The other input of the amplifier 158 is supplied with the output of an envelope detector 160, which is connected to the output of the integrated circuit 150 to provide a feedback loop. A peak detector may be provided in place of the envelope detector in some aspects. The feedback loop is configured so that the peak of the transmitter signal Tx driving the antenna network is at or near the maximum voltage sustainable for the chip. In certain aspects, the peak voltage is five volts. Since the transmitter signal Tx is close to a square wave, the feedback or control loop needs the peak or envelope amplitude.

The amplified output of the amplifier 158 is connected to a pulse width modulator (PWM) 162. A reference input of the pulse width modulator 162 is connected to receive the output of an oscillator 164. In the illustrated example, the oscillator 164 is a 13.56 MHz oscillator, the carrier frequency commonly used for near field communications. An oscillator that generates any frequency that is used for inductive or near field communication may be used. The pulse width modulator 162 integrates the regulation function and the modulation function into the modulator. The two inputs are combined to control the transmitted near field communication signal. In particular the integrated regulation and modulation function of the pulse width modulator 162 regulates the output according to the modulation as well as compensates for any noise from the power source, such as noise from the battery power source. The output of the pulse width modulator 162 is provided to the gate of a power transistor 166, which provides the amplified output of the circuit at 168.

A pulse width modulator may be made of a triangular wave generator and a comparator that are connected to compare the output of the op amp with the triangular wave. In certain aspects, the pulse width modulator with two inputs may be implemented by multiplying the op amp output by an amplitude factor (either digitally or in the analog domain) before comparing the level to the triangular wave. The amplitude factor will be different depending on the bit that needs to be represented. The two input pulse width modulator may be constructed in many different aspects to achieve the desire result as will be understood by those of skill in the art.

The integrated pulse width modulator 162 drives a single power transistor 166. The pulse width modulator 162 is provided with the carrier frequency of the near field communication device by the oscillator 164. The envelope detector 160 or a linear filter provides an analog control loop.

A battery voltage 170, such as provided by a battery, powers the circuit. The battery voltage is provided via an external filter 172 that includes an inductor 174 through which the battery voltage is provided to the output 168 of the integrated circuit 150. A capacitor 176 is connected from the output 168 to ground to complete the filter. The battery voltage provided to the external filter is the only power source for the power amplifier of the NFC transmitter. Other sections of the NFC circuit including other seconds of the transmitter have their own regulators that are a source of power from the same battery. The other sections do not require as much current as the power amplifier. The LC filter 174 and 176 is external to the chip and filters the converted voltage output to remove spurious signals. The output signal is a signal that has an envelope that represents the line encoded data bits that were input by the modulation control 156. The filtered output of the external filter 172 is connected to a near field communication (NFC) antenna and tuning circuit 178 that includes capacitors 180 and 182 and an antenna 184. The antenna and tuning circuit 178 is similar to the antenna shown elsewhere in this disclosure.

The functions of the DCDC voltage regulator, the NFC modulator, and the power amplifier are combined into a single circuit on an integrated circuit, for example on a single integrated circuit chip. The combined circuit provides higher power efficiency than was available with conventional devices but also provides lower device costs. In this configuration, the switching function that provides the DCDC voltage regulation is also used for generating the near field communication carrier signal. The pulse width modulation function that provides the voltage regulation in the DCDC voltage regulator is also to modulate the signal for the near field communication data and information transmission. In the DCDC regulator, the inductor is used to boost the battery voltage to a higher supply voltage. The primary role of the inductor is for voltage boosting. The capacitor is combined with the boost inductor to function as a filter to reduce spurious signals. The inductors and capacitors have been used to filter the output voltage of the DCDC voltage regulator of the conventional devices. In the present example, the combination of the inductor and capacitor may function as an EMI filter of the near field communication front end.

Aspects of the near field communication device combine the functions of the modulator and the power amplifier. The near field communication device skips the step of generating a 5 volt DC signal as in the traditional approach as shown in FIG. 5 and directly chops the battery voltage through the inductance. The chopping provides directly a boosted 5 volt Class-D signal. The near field communication device of this aspect eliminates the inductor that is used in a conventional DCDC voltage regulator. In aspects of the near field communication device, a capacitor is used but the capacitor that is required in the present device has a smaller capacitance than the capacitors used in the conventional devices. The capacitor of the near field communication device according to this disclosure operates to provide spurious signal filtering. The capacitor may have a lower capacitance value than the capacitor in the conventional devices. In a conventional DCDC voltage regulator, a capacitor is used that has a value of greater an one micro Farad (1 µF), whereas the capacitor used in aspects of the present circuit may use a capacitor of about ten nano Farads (10 nF).

The DCDC voltage boost function is performed at the same frequency as the Class D power amplifier function of conventional near field communication devices. In certain aspects, a signal at the near field communication carrier frequency of 13.56 MHz is used for both the voltage regulation function and to directly generate the near field communication radio frequency signal.

Modulation of the near field communication signal is provided by synchronously modulating the operation of the DCDC voltage regulator. The result is that interference between the DCDC voltage regulator operating frequency and the frequency of the RF signal which occurs in the convention devices is avoided in the present devices. This provides an advantage over the devices in which the DCDC voltage regulators are operated at a frequency in a range of about 3 MHz to 5 MHz and the power amplifier is operated a 13.56 MHz carrier frequency that is asynchronous to the frequency of the voltage regulator. The use of synchronous voltage regulation and radio frequency signal generation eliminates a significant source of EMI emissions.

Referring back to FIG. 5, a conventional near field communication device uses three power transistors for the voltage regulator function and two power transistors for the power amplifier function. In examples of the conventional device, the DCDC voltage regulator 100 uses one large NMOS power transistor and one large PMOS power transistor 112 and one large NMOS power transistor 110 to generated a boosted and regulated voltage. The power amplifier 122 uses one large NMOS power transistor 124 and one large PMOS power transistor 126. The power transistors 110, 124 and 126 and the transistor pair 112 occupy a significant amount of area on the silicon chip, so much so that most of the silicon area of the conventional NFC device chip is used for the power transistors.

As can be seen by comparing FIGS. 5 and 6, the near field communication device according to the illustrated aspect uses only a single power transistor. This is accomplished by merging the functions of the voltage converter and the power amplifier. In an example, the single power transistor is an NMOS power transistor, although other power transistors are of course possible. The chip area required for the power transistors is approximately one fifth of the area of the conventional circuit chips. Since so much of the overall circuit area is for the power transistors, the circuit according to the present aspect provides an almost five to one reduction in the chip area compared to the conventional circuits. The reduction in the chip area may be referred to as a first order die savings, which is estimates the reduction in the chip area before taking into account any secondary effects that may result in additional die savings or die size increase. The smaller chip area required not only reduces costs but also permits the portable device in which the device is provided to be made smaller or to include other features without increasing its size.

As seen in FIG. 5, the battery current passes through two series connected MOS transistors 124 and 126 to provide current to the antenna network at the load. In the circuit of FIG. 6, by contrast, the battery current is directly connected to the antenna network (which here is through the external filter). The battery current is provided to the load without being connected through a MOS transistor. The circuit according to this aspect has a much lower IR drop (the drop in the voltage as the current (I) passes through the resistance (R)) from the battery to the antenna than the conventional device, which provides better efficiency and better performance.

The near field communication device according to the present aspects provides improvements over the convention near field communication devices by requiring a smaller area in a silicon chip compared to conventional devices that integrate the voltage regulation function on the integrated circuit chip. In a 65 nm chip fabrication process technology, the circuit according to the present aspect provides an 80% reduction in the chip area used.

The near field communication device according to the present aspects provides improvements over the conventional near field communication devices by providing operation directly from the battery without the need for a regulated supply from an off-chip voltage regulator for DCDC voltage regulation.

The near field communication device according to the present aspects provides improvements over the conventional near field communication devices by requiring one less inductor than conventional devices. Inductors may occupy a relatively large area on a printed circuit board (PCB). For example, an inductor may have a package size of 0.06 inches by 0.03 inches (package size code 0603). The reduction in the number of inductors required for the near field communication device permits smaller printed circuit boards to be used for the device.

The efficiency of the near field communication device according to the present aspect is greater than that of the conventional near field communication devices, even though the voltage regulator is integrated on the chip with the power amplifier.

The aspect shown in FIG. 6 modulates the signal outside of the pulse width modulation loop. In other words, the pulse width modulation function provided by the modulator 162 is performed without the amplitude modulation being in the loop.

Figure 7:
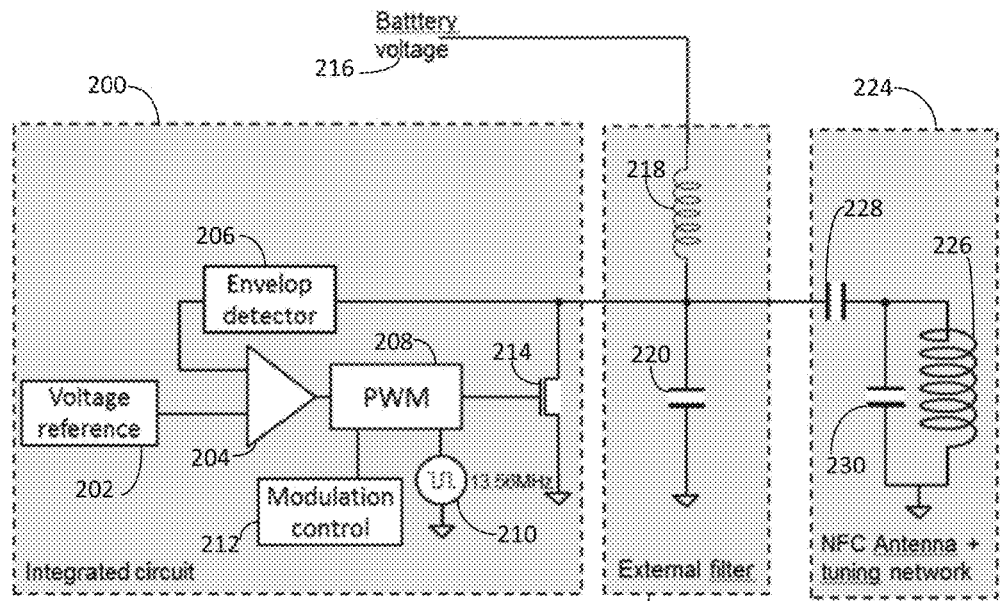
FIG. 7 is a circuit diagram of a near field communication device in accordance with another aspect of the disclosure.

Another aspect is shown in FIG. 7 in which the amplitude modulation control is within the pulse width modulation loop. In particular, an integrated circuit 200 that includes a voltage reference 202 that provides the reference signal to an input of an amplifier 204, such as an operational amplifier. The other input of the amplifier 204 is an output from an envelope detector 206 that generates its signal from the output of the integrated circuit 200 to provide a linear feedback or control loop. The amplifier output is provided to a pulse width modulator 208 that operates at a frequency provided by the oscillator 210. In the illustrated example, the oscillator frequency is the carrier frequency of near field communications, 13.56 MHz. Data and information are modulated onto the pulse width modulation signal by a modulation control 212 that is provided to an input of the pulse width modulator 208. The modulation control is thus within the pulse width modulation loop.

Other components are the same or similar. The output of the pulse width modulator 208, which is at the carrier frequency and has the pulse width modulation corresponding to the modulation data or information impressed thereon, is provided to the gate of a power transistor 214. This is the sole power transistor required in this aspect. Battery voltage 216 is provided through an inductor 218 and a capacitor 220 of an external filter 222 that is outside of the integrated circuit 200 and off chip. The filtered output is provided to the near field communication antenna and tuning network 224 that includes an antenna 226 and capacitors 228 and 230. Thus, aspects are shown with the modulation being provided either outside of or inside of the pulse width modulation loop.

Figure 8:
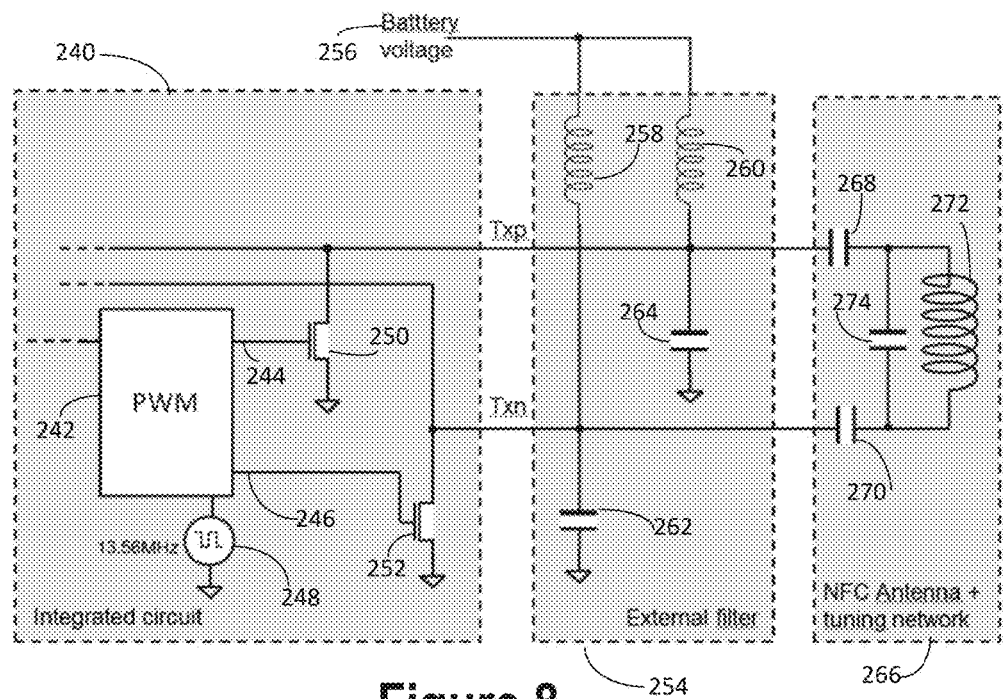
FIG. 8 is a circuit diagram of a field communication device in accordance with yet another aspect of the disclosure, similar elements to the circuits of FIGS. 6 and 7 being shown as ellipses.
Figure 8A:
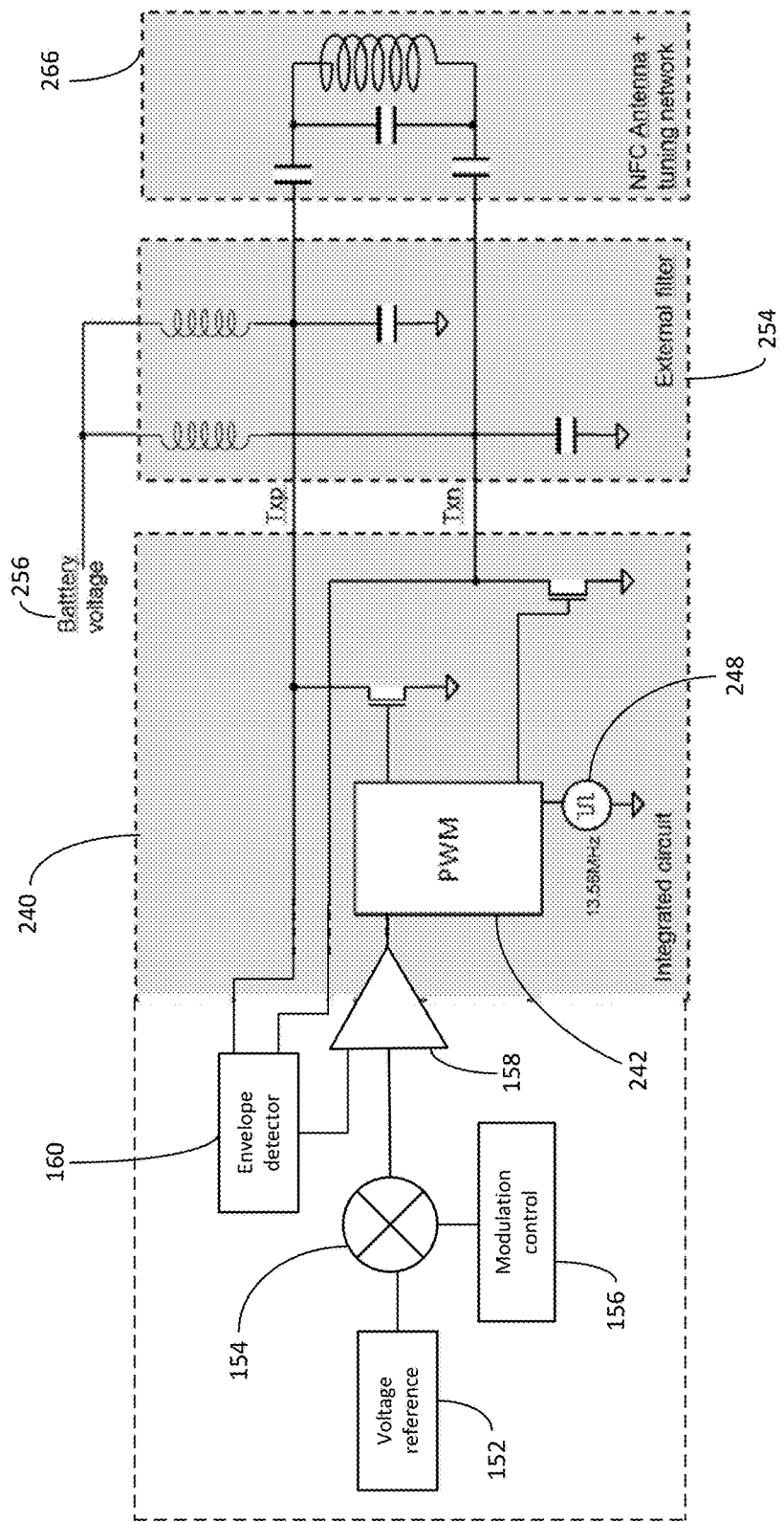
FIG. 8a is a circuit diagram similar to FIG. 8 with elements of FIG. 6 shown in place of the ellipses of FIG. 8.

With reference to FIG. 8 and FIG. 8a, a differential antenna configuration may be provided. FIG. 8 shows how to connect the pulse width modulator and other elements to provide signals to a differential antenna. The elements which are the same or similar to those of the aspects shown herein are indicated with ellipses in FIG. 8. In certain aspects as shown for example in FIG. 8a, the circuit elements on the integrated circuit 240 represented by the ellipses include a single envelope detector 160a and a single error amplifier 158 connected as shown in FIG. 6 or 7, for example. If a single envelope detector 160a is used, only a single signal envelope detector signal is fed into the pulse width modulator 424. Two envelope detectors may instead be used, and the outputs of both envelope detectors are provided to the pulse width modulator 424. Other elements may include a voltage reference 152 and modulation control 156, as shown in FIG. 8a. The modulation control may be provided either outside of or inside of the pulse width modulation loop as described above. The details will be understood by those of skill in the art from the features described elsewhere in this specification.

The integrated circuit 240 includes a pulse width modulator 242 that has a differential output, or more specifically two outputs 244 and 246 that are opposite in phase to each other. The pulse width modulator 240 of certain aspects is driven at the carrier frequency of 13.56 MHz by an oscillator 248. The modulated outputs 244 and 246 are provided to the gates of power transistors 250 and 252. The power transistors 250 and 252 provide outputs Txp and Txn from the integrated circuit 240.

Filtering of each output Txp and Txn by an external filter 254. The external filter 254 is connected to battery voltage 256 that is linked to the outputs Txp and Txn by inductors 258 and 260. The filters are completed by capacitors 262 and 264 that connect to ground. The filtered outputs are supplied to a near field communication antenna and tuning network 266 that is connected in a differential configuration. In particular, the input leads are connected through capacitors 268 and 270. An antenna coil 272 is provided, across which is connected a capacitor 274.

The differential circuit shown in FIG. 8 was operated in a simulation of near field communication operation. The output signal was modulated with a constant frequency periodic signal, which in some instances may approximate a square wave, during the simulation. For a first simulation run, the battery output voltage was set to 4 volts. A 4 volt battery output may represent a fully charged battery in a smart phone or other portable device.

Figure 9A:
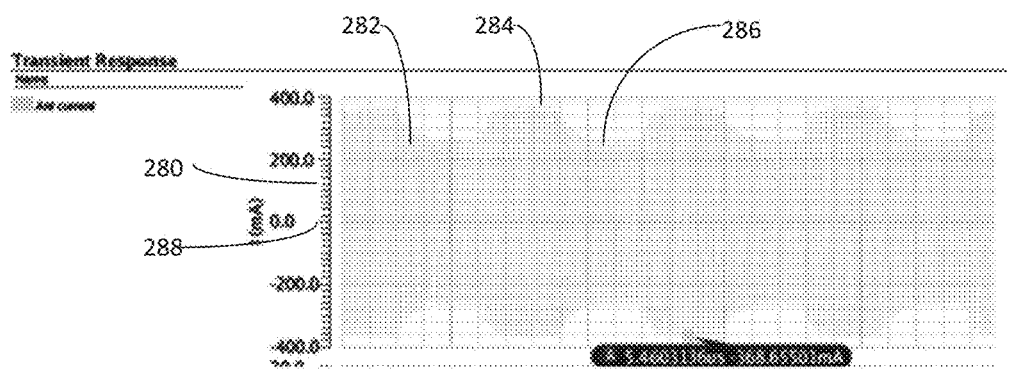
FIGS. 9a, 9b, 9c and 9d are graphs of signals generated by the circuit of FIG. 8 according to a simulation at a 4 volt battery power level.

In FIG. 9a is shown a graph 280 of the antenna current signal 282 that passes through the near field communication antenna 272. The modulation signal may be seen impressed on the antenna current as periodic variations in the amplitude of the current signal 282 as peaks 284 and valleys 286. The current is of equal magnitude on both sides of the zero axis 288 as a result of the differential driving of the antenna. If the antenna were driven by a non-differential device, the signals would appear on only one side of the zero axis.

Figure 9B:
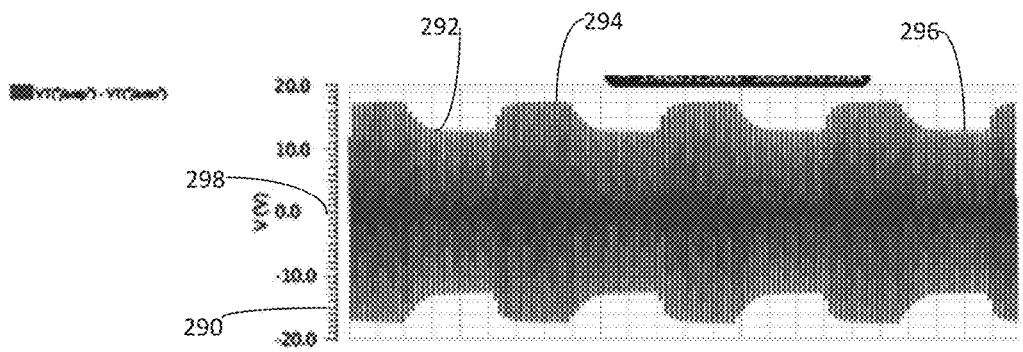

FIG. 9*b* is a graph 290 that shows the voltage signal 292 across the antenna 272 of the differential device. The voltage follows the same periodic variation impressed by the modulation signal on the carrier with peaks 294 and valleys 296. The envelope of the signal represents the line encoded data bits provided by the modulation control. The voltage is on both sides of the zero axis 298. Note that the peak voltage is greater than the battery voltage of 4 volts. In the example, the voltage peaks are plus and minus approximately 16 volts.

Figure 9C:
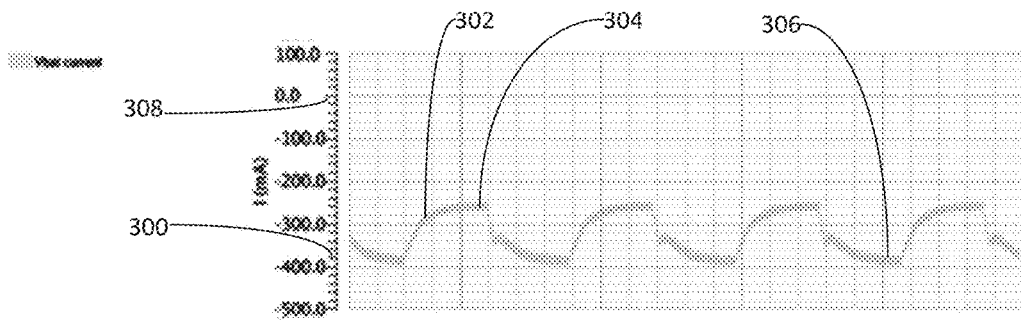

FIG. 9*c* is a graph 300 showing the battery current signal 302. Variations in the battery output track the changes in the periodic signal of the antenna current, including peaks 304 and valleys 306. The average of the current signal 302 is below the zero axis 308.

Figure 9D:
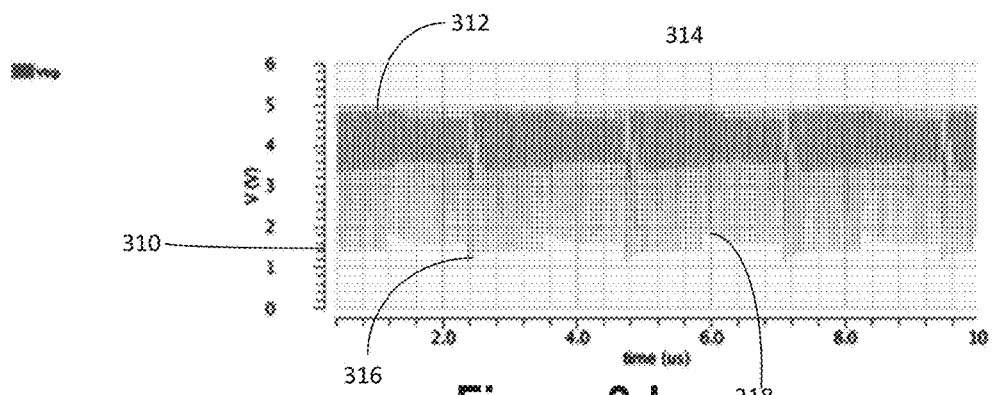

FIG. 9*d* is a graph 310 showing the output voltage signal 312 at the output of the driver or output of the integrated circuit. In the illustrated example, the voltage signal 312 is the voltage at the pin Txp in the differential circuit of FIG. 8. The voltage signal 312 has a constant or nearly constant top voltage level of approximately 5 volts. This is greater than the voltage of the battery supplying the circuit, which is set to 4 volts in the simulation. The lower end of the pulses includes peaks 316 and valleys 318 that vary depending on the modulation signal.

Figure 10A:
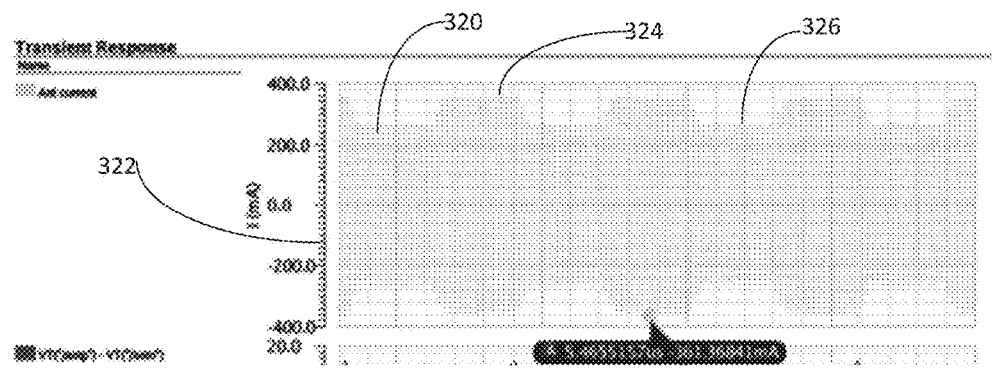
FIGS. 10a, 10b, 10c and 10d are graphs of signals generated by the circuit of FIG. 8 according to a simulation at a 2.2 volt battery power level.

A second simulation was run for the differential circuit but this time at a battery voltage of 2.2 volts. This represents a residual charge in the battery or battery that requires charging, for example. The antenna current 320 is shown in the graph 322 of FIG. 10*a*. The peaks 324 and valleys 326 of the signal 320 represent the impressed modulation signal. The magnitude of the current is maintained at the same level as in the 4 volt simulation by varying the average duty cycle of the pulse width modulator.

Figure 10B:
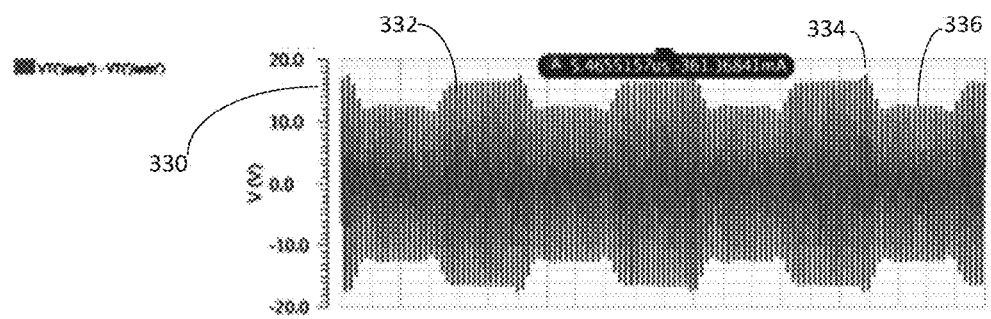

FIG. 10*b* is a graph 330 of the voltage signal 332 through the antenna at 2.2 volts battery power. The approximately 16 volt peak voltage at the peaks 334 is maintained even with the low battery, and for both the positive and negative voltages. The valleys 336 are still sufficiently distinct to effectively provide near field communication with another device.

Figure 10C:
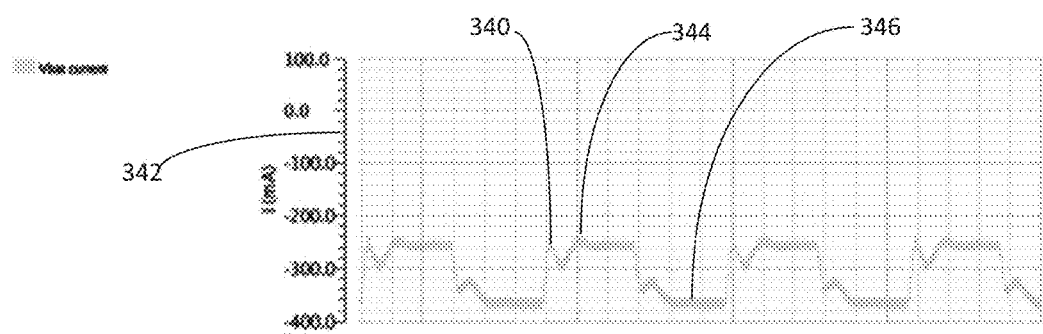

The battery current signal 340 at 2.2 volts of battery power is shown in FIG. 10*c* in the graph 342. The signal 340 includes peaks 344 and valleys 346, although the signal 340 is of a different shape than the battery current at 4 volts.

Figure 10D:
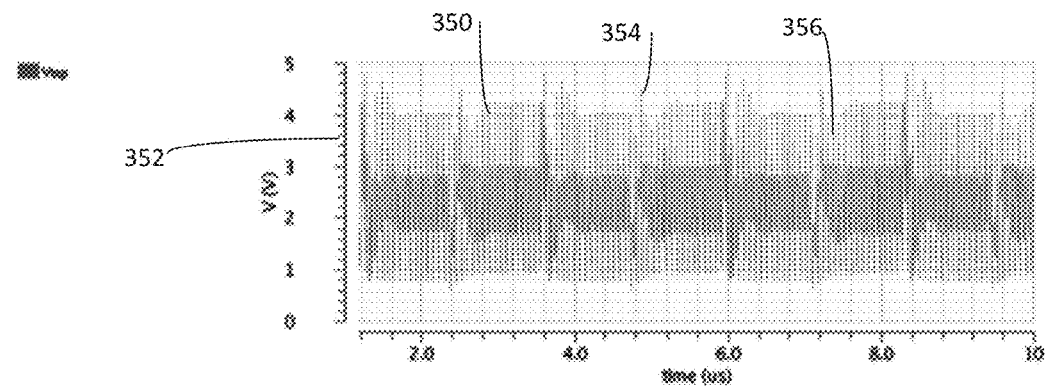

FIG. 10*d* shows the output voltage signal 350 in a graph 352 at the output pin Txp. The output voltage 350 is lower than in the 4 volt example, but still sufficient to communicate the data via near field communication. The duty cycle of the PWM is provided to control the peak voltage on the TXP and the TXN output and keep it at approximately 5 volts such that the current in the antenna is maximized.

The average battery current is very close to the peak antenna current. The peak antenna voltage is about 16 volts diff. The antenna inductance in an example is about 513 nH, for an antenna that is a two turn 30 by 50 mm PCB trace. The current efficiency of the device is about 70% (measured as RMS antenna current/average battery current). As a result of greater efficiency, battery life of the portable device is increased when using near field communications.

Thus, there is shown and described a near field communication device that includes a pulse width modulator that is provided with an oscillator signal at a near field communication carrier frequency. The pulse width modulator input is an amplified reference voltage that is regulated by a feedback loop. A modulation control provides the data signal to be transmitted. The modulation control may either be provided to the amplifier mixed with the reference voltage or may be provided to the pulse width modulator. A power transistor receives the pulse width modulator output and generates a chip output signal. An external filter is connected at the chip output to filter the signal, providing an amplitude modulated sinusoidal signal that is provided to the near field communication antenna's tuning network. The power source is connected to the external filter. A differential version includes differential outputs from the pulse width modulator to two power transistors and through two external filters to a differential antenna.

EXAMPLES

Example 1 is a communication device, comprising: an amplifier connected to receive a voltage reference and a feedback signal and operable to generate an input signal; a pulse width modulator connected to receive an oscillator signal and the input signal and operable to generate a modulated output; a power transistor having an input connected to receive the modulated output and having an output; and a filter connected to the output of the power transistor and operable to provide a filtered output, the filtered output being configured for connection to a antenna.

In Example 2, the subject matter of Example 1, wherein the pulse width modulator receives a modulation control signal mixed with the input signal and is operable to vary the modulated output based on the modulation control signal.

In Example 3, the subject matter of Example 1, wherein the pulse width modulator receives a modulation control signal and is operable to vary the modulated output based on the modulation control signal, and comprises a separate input connected to receive the modulation control signal.

In Example 4, the subject matter of Example 1, wherein the pulse width modulator includes a differential output; wherein the power transistor is a first power transistor with a first output; and further comprising: a second power transistor having an input connected to receive the differential output of the pulse width modulator, the second power transistor having a second output, wherein the first and second outputs are configured for connection to first and second differential inputs of an antenna.

In Example 5, the subject matter of Example 1, further comprising: an envelope detector connected to the output of the power transistor and operable to generate the feedback signal for the amplifier.

In Example 6, the subject matter of Example 1, wherein the amplifier, the pulse width modulator and the power transistor are on a same integrated circuit chip.

In Example 7, the subject matter of Example 1, wherein the communication device is a near field communication device.

Example 8 is a communication device, comprising: an integrated circuit chip having a chip output, the integrated circuit chip including: a pulse width modulator formed on the integrated circuit chip and having a signal input and an oscillator input and a pulse width output; an oscillator formed on the integrated circuit chip and operable at a carrier frequency, the oscillator having an oscillator signal output connected to the oscillator input of the pulse width modulator, the oscillator driving the pulse width modulator at the carrier frequency; a power transistor formed on the integrated circuit chip and having a signal input connected to a pulse width output of the pulse width modulator, the power transistor having an output connected to the chip output of the integrated circuit chip; an amplifier formed on the integrated circuit chip and having a signal output connected to the signal input of the pulse width modulator, the amplifier having first and second inputs; a voltage reference formed on the integrated circuit chip and having a reference voltage output, the reference voltage output being connected to a first input of the amplifier, the voltage reference being operable to output a reference voltage on the reference voltage output; a feedback loop connected between the chip output and the second input of the amplifier; a modulation control formed on the integrated circuit chip and connected to provide a modulation signal to the pulse width modulator; and an external filter connected to the chip output and having an antenna output that is configured for connection to a communication antenna, the external filter having an input for connection to a power source.

In Example 9, the subject matter of Example 8, wherein the pulse width modulator includes a modulation input, and wherein the modulation control has an output is connected to the modulation input of the pulse width modulator, the pulse width modulator being operable to modulate the pulse width output with a signal output from the modulation control.

In Example 10, the subject matter of Example 8, further comprising: a multiplier formed on the integrated circuit chip and having first and second inputs and an output, the first input of the multiplier being connected to the reference voltage output of the voltage regulator, the second input of the multiplier being connected to the modulation control, the output of the multiplier being connected to the first input of the amplifier.

In Example 11, the subject matter of Example 8, wherein the pulse width modulator includes a differential output; wherein the power transistor is a first power transistor; wherein the chip output is a first chip output; and further comprising: a second chip output; and a second power transistor formed on the integrated circuit chip and having a signal input connected to the differential output of the pulse width modulator, the second power transistor having an output connected to the second chip output.

In Example 12, the subject matter of Example 11, wherein the external filter is a first external filter, and further comprising: a second external filter having an input connected to the second chip output, the second external filter having a differential output configured for connection to a differential input of a communication antenna.

In Example 13, the subject matter of Example 8, wherein the external filter includes an inductor connected between the power supply and the chip output, and further includes a capacitor connected between the chip output and ground.

In Example 14, the subject matter of Example 8, further comprising: an envelope detector formed on the integrated circuit chip and connected in the feedback loop, the envelope detector having an input connected to the chip output and having an output connected to the second input of the amplifier.

In Example 15, the subject matter of Example 8, wherein the pulse width modulator is operable to provide a modulated signal at the pulse width output.

In Example 16, the subject matter of Example 8, wherein the communication device is a near field communication device.

Example 17 is a method for generating a communication signal, comprising: generating a reference voltage; modulating the reference voltage with a modulation signal to generate a modulated reference signal; amplifying the modulated reference voltage to provide an amplified signal; generating an oscillation signal at a carrier frequency; pulse width modulating the amplified signal at the carrier frequency using with the oscillation signal to obtain a pulse width modulated carrier signal; amplifying the pulse width modulated carrier signal to provide an output signal; regulating the amplified signal based on the output signal; filtering the output signal to obtain a filtered output signal; and supplying the filtered output signal to a communication antenna.

In Example 18, the subject matter of Example 17, further comprising: generating a differential pulse width modulated carrier signal from the amplified signal and the oscillation signal; amplifying the differential pulse width modulated carrier signal to provide a differential output signal; filtering the differential output signal to provide a filtered differential output signal; and supplying the filtered differential output signal to a differential input of the communication antenna.

In Example 19, the subject matter of Example 17, wherein the communication signal is a near field communication signal.

Example 20 is a method for generating a communication signal, comprising: generating a reference voltage; amplifying the reference voltage to provide an amplified signal; generating an oscillation signal at a carrier frequency; pulse width modulating the amplified signal at the carrier frequency using with the oscillation signal and with a modulation signal to obtain a modulated carrier signal; amplifying the modulated carrier signal to provide an output signal; regulating the amplified signal based on the output signal; filtering the output signal to obtain a filtered output signal; and supplying the filtered output signal to a communication antenna.

In Example 21, the subject matter of Example 20, further comprising: generating a differential modulated carrier signal from the amplified signal and the oscillation signal and the modulation signal; amplifying the differential modulated carrier signal to provide a differential output signal; filtering the differential output signal to provide a filtered differential output signal; and supplying the filtered differential output signal to a differential input of the communication antenna.

In Example 22, the subject matter of Example 20, wherein the communication signal is a near field communication signal.

Example 23 is a communication device, comprising: means for comparing a voltage reference and a feedback signal to obtain an input signal; means for generating a modulated output from the input signal and an oscillator signal, the means for generating the modulated output generating the modulated output based on a modulation control signal; a power transistor having an input connected to receive the modulated output and having an output; and means for filtering the output of the power transistor to provide a filtered output, the filtered output being connected to a communication antenna.

In Example 24, the subject matter of Example 23, wherein the reference voltage received by the means for comparing includes a combined voltage reference and modulation control signal.

In Example 25, the subject matter of Example 23, wherein the means for generating a modulated output receives a modulation control signal at a separate input from the input signal received from the means for comparing.

In Example 26, the subject matter of Example 24 or Example 25, wherein the feedback signal is generated by a means for detecting an envelope of the power transistor output.

In Example 27, the subject matter of Example 23, wherein the means for generating a modulated output generates a differential modulated output, and further comprising: a second power transistor having an input connected to receive the differential modulated output and operable to generate a differential output for connection to a differential input of the communication antenna.

In Example 28, the subject matter of Example 23, wherein the means for comparing, the means for generating, and the power transistor are on a same integrated circuit chip.

In Example 29, the subject matter of Example 23, wherein the communication device is a near field communication device.

Example 30 is an apparatus or method substantially as shown.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A communication device, comprising:
   an integrated circuit on a chip including:
      an amplifier configured to receive a voltage reference and a feedback signal having a first modulation control signal and configured to generate an input signal;
      an oscillator configured to generate an oscillator signal at a carrier frequency for the communication device at an oscillator output;
      a modulation control circuit configured to generate a second modulation control signal having data or information to be communicated;
      a pulse width modulator having an oscillator signal input connected to the oscillator output and configured to receive the oscillator signal, the pulse width modulator having an input for receiving the input signal separate from the oscillator signal, the pulse width modulator being configured to generate a modulated output at the carrier frequency, the pulse width modulator receiving the first modulation control signal in the feedback signal and receiving the second modulation control signal having the data or information to be communicated and generated by the modulation control circuit, the pulse width modulator being configured to vary the modulated output at the carrier frequency in accordance with the first modulation control signal and the second modulation control signal; and
      a power transistor having an input connected to the modulated output of the pulse width modulator and having an output, the output being used to generate the feedback signal; and
      a filter connected to the output of the power transistor and configured to provide a filtered output, the filtered output being configured for connection to an antenna.

2. The communication device as claimed in claim 1, wherein the pulse width modulator receives the second modulation control signal mixed with the input signal and is configured to vary the modulated output based on the second modulation control signal.

3. The communication device as claimed in claim 1, wherein the pulse width modulator receives the second modulation control signal at an input separate from the input signal of the amplifier and is configured to vary the modulated output based on the second modulation control signal, and comprises a separate input connected to receive the second modulation control signal.

4. The communication device as claimed in claim 1, wherein the integrated circuit further includes:
   an envelope detector on the chip and connected to the output of the power transistor, the envelope detector being configured to generate the feedback signal for the amplifier.

5. The communication device as claimed in claim 1, wherein the amplifier, the pulse width modulator and the power transistor are on a same integrated circuit chip.

6. The communication device as claimed in claim 1, wherein the communication device is a near field communication device.

7. A communication device, comprising:
   an amplifier configured to receive a voltage reference and a feedback signal, the amplifier being configured to generate an input signal;
   a pulse width modulator configured to receive an oscillator signal and the input signal, the pulse width modulator being configured to generate a modulated output, the pulse width modulator including a differential output;
   a power transistor having an input connected to the modulated output of the pulse width modulator and having an output, the power transistor being a first power transistor having the input connected to the differential output of the pulse width modulator and having a first output;
   a filter connected to the output of the first power transistor and configured to provide a filtered output, the filtered output being configured for connection to an antenna; and
   a second power transistor having an input connected to the differential output of the pulse width modulator and having a second output connected to the filter, wherein the first and second outputs of the respective first and second power transistors are configured for connection through the filter to first and second differential inputs of the antenna.

8. A communication device, comprising:
   an integrated circuit chip having a chip output, the integrated circuit chip including:
      a pulse width modulator formed on the integrated circuit chip, the pulse width modulator having a signal input, a separate oscillator input, and a pulse width output;
      an oscillator formed on the integrated circuit chip and configured at a carrier frequency, the oscillator having an oscillator signal output connected to the separate oscillator input of the pulse width modulator, the oscillator driving the pulse width modulator at the carrier frequency of the communication device;

a power transistor formed on the integrated circuit chip and having a signal input connected to the pulse width output of the pulse width modulator, the power transistor having an output connected to the chip output of the integrated circuit chip;

an amplifier formed on the integrated circuit chip and having a signal output connected to the signal input of the pulse width modulator, the amplifier having first and second inputs;

a voltage reference generator formed on the integrated circuit chip and having a reference voltage output, the reference voltage output being connected to the first input of the amplifier, the voltage reference generator being configured to output a reference voltage on the reference voltage output;

a feedback loop connected between the chip output and the second input of the amplifier, the feedback loop providing a first modulation control signal to the second input of the amplifier; and a modulation control circuit formed on the integrated circuit chip and configured to provide a second modulation control signal to the pulse width modulator, the modulation control circuit being configured to provide data or information in the second modulation control signal to be communicated to the pulse width modulator at an input separate from the separate oscillator input;

wherein the pulse width modulator being configured to generate a pulse width modulator signal at the pulse width output at the carrier frequency and on which is impressed the data or information signal of the modulation control circuit; and an external filter connected to the chip output and having an antenna output that is configured for connection to a communication antenna, the external filter having an input for connection to a power source.

9. The communication device as claimed in claim 8, wherein the input separate from the separate oscillator input is a modulation input, and wherein the modulation control circuit has an output connected to the modulation input of the pulse width modulator, the pulse width modulator being configured to modulate the data or information signal from the modulation control circuit to generate the pulse width output.

10. The communication device as claimed in claim 8, further comprising:

a multiplier formed on the integrated circuit chip and having first and second inputs and an output, the first input of the multiplier being connected to the reference voltage output of the voltage reference generator, the second input of the multiplier being connected to receive the second modulation control signal of the modulation control circuit, and the output of the multiplier being connected to the first input of the amplifier.

11. The communication device as claimed in claim 8, wherein the external filter includes an inductor connected between the power source and the chip output, and further includes a capacitor connected between the chip output and ground.

12. The communication device as claimed in claim 8, further comprising:

an envelope detector formed on the integrated circuit chip and connected in the feedback loop, the envelope detector having an input connected to the chip output and having an output connected to the second input of the amplifier.

13. The communication device as claimed in claim 8, wherein the communication device is a near field communication device.

14. A communication device, comprising:

an integrated circuit chip having a chip output, the integrated circuit chip including:

a pulse width modulator formed on the integrated circuit chip, the pulse width modulator having a signal input, an oscillator input, and a pulse width output;

an oscillator formed on the integrated circuit chip and configured at a carrier frequency, the oscillator having an oscillator signal output connected to the oscillator input of the pulse width modulator, the oscillator driving the pulse width modulator at the carrier frequency;

a power transistor formed on the integrated circuit chip and having a signal input connected to the pulse width output of the pulse width modulator, the power transistor having an output connected to the chip output of the integrated circuit chip;

an amplifier formed on the integrated circuit chip and having a signal output connected to the signal input of the pulse width modulator, the amplifier having first and second inputs;

a voltage reference generator formed on the integrated circuit chip and having a reference voltage output, the reference voltage output being connected to the first input of the amplifier, the voltage reference generator being configured to output a reference voltage on the reference voltage output;

a feedback loop connected between the chip output and the second input of the amplifier; and a modulation control circuit formed on the integrated circuit chip and configured to provide a modulation signal to the pulse width modulator;

an external filter connected to the chip output and having an antenna output that is configured for connection to a communication antenna, the external filter having an input for connection to a power source;

wherein the pulse width modulator includes a differential output;

wherein the power transistor is a first power transistor having a signal input connected to the differential output of the pulse width modulator and an output connected to a first chip output of the integrated circuit chip;

wherein the chip output is the first chip output; and further comprising:

a second chip output; and a second power transistor formed on the integrated circuit chip and having a signal input connected to the differential output of the pulse width modulator, the second power transistor having an output connected to the second chip output.

15. The communication device as claimed in claim 14, wherein the external filter is a first external filter having the input connected to the first chip output and a first antenna output of a differential output configured for connection to a first input of a differential input of the communication antenna, and further comprising:

a second external filter having an input connected to the second chip output and a second antenna output of the differential output configured for connection to a second input of the differential input of the communication antenna.

16. A method for generating a communication signal, comprising:
- generating a reference voltage;
- generating a feedback signal including a first modulation signal;
- modulating the reference voltage with a second modulation signal to generate a modulated reference signal, the second modulation signal including data or information to be communicated;
- amplifying the modulated reference signal and the feedback signal to provide an amplified signal;
- generating an oscillation signal at a carrier frequency of the communication signal;
- pulse width modulating the amplified signal at the carrier frequency with the oscillation signal to obtain a pulse width modulated carrier signal at the carrier frequency on which is impressed the data or information of the modulation signal;
- providing an output signal from the pulse width modulated carrier signal by a power transistor, the output signal being used to generate the feedback signal;
- regulating the amplified signal based on the feedback signal;
- filtering the output signal to obtain a filtered output signal; and
- supplying the filtered output signal as the communication signal to a communication antenna.

17. The method of claim 16, wherein the communication signal is a near field communication signal.

18. A method for generating a communication signal, comprising:
- generating a reference voltage;
- modulating the reference voltage with a modulation signal to generate a modulated reference signal;
- generating a feedback signal;
- amplifying the modulated reference signal with the feedback signal to provide an amplified signal;
- generating an oscillation signal at a carrier frequency;
- pulse width modulating the amplified signal at the carrier frequency with the oscillation signal to obtain a pulse width modulated carrier signal;
- providing an output signal from the pulse width modulated carrier signal by a power transistor, the output signal being used to generate the feedback signal;
- regulating the amplified signal based on the feedback signal;
- filtering the output signal to obtain a filtered output signal; and
- supplying the filtered output signal as the communication signal to a communication antenna;
- wherein the pulse width modulating comprises generating a differential pulse width modulated carrier signal from the amplified signal and the oscillation signal;
- wherein the providing comprises providing a differential output signal from the differential pulse width modulated carrier signal;
- wherein the filtering comprises filtering the differential output signal to provide a filtered differential output signal; and
- wherein the supplying comprises supplying the filtered differential output signal to a differential input of the communication antenna.

19. A method for generating a communication signal, comprising:
- generating a reference voltage;
- receiving a feedback signal having a first modulation signal;
- modulating the reference voltage with a second modulation signal to generate a modulated reference signal;
- amplifying the modulated reference signal and the feedback signal to provide an amplified signal;
- generating an oscillation signal at a carrier frequency;
- pulse width modulating the amplified signal at the carrier frequency using the oscillation signal, the first modulation signal, and the second modulation signal to obtain a modulated carrier signal at the carrier frequency, the modulated carrier signal having data or information of the second modulation signal to be communicated impressed onto the modulated carrier signal;
- providing an output signal from the modulated carrier signal, the output signal being used to generate the feedback signal;
- regulating the amplified signal based on the feedback signal;
- filtering the output signal to obtain a filtered output signal; and
- supplying the filtered output signal as the communication signal to a communication antenna.

20. The method of claim 19, wherein the communication signal is a near field communication signal.

21. A method for generating a communication signal, comprising:
- generating a reference voltage;
- modulating the reference voltage with a modulation signal to generate a modulated reference signal;
- amplifying the modulated reference signal with a feedback signal to provide an amplified signal;
- generating an oscillation signal at a carrier frequency;
- pulse width modulating the amplified signal at the carrier frequency using the oscillation signal and the modulation signal to obtain a modulated carrier signal;
- providing an output signal from the modulated carrier signal by a power transistor, the output signal being used to generate the feedback signal;
- regulating the amplified signal based on the feedback signal;
- filtering the output signal to obtain a filtered output signal;
- supplying the filtered output signal as the communication signal to a communication antenna;
- wherein the pulse width modulating comprises generating a differential modulated carrier signal from the amplified signal, the oscillation signal, and the modulation signal;
- wherein the providing comprises providing a differential output signal from the differential modulated carrier signal;
- wherein the filtering comprises filtering the differential output signal to provide a filtered differential output signal; and
- wherein the supplying comprises supplying the filtered differential output signal to a differential input of the communication antenna.

* * * * *